(12) United States Patent
Khosravi et al.

(10) Patent No.: US 7,667,467 B2
(45) Date of Patent: Feb. 23, 2010

(54) METHOD AND SYSTEM FOR DETERMINING ANTENNA CHARACTERIZATION

(75) Inventors: Mahmood F. Khosravi, Bedford, NH (US); Robert B. Lombardi, Nashua, NH (US); Donald B. Spencer, Merrimack, NH (US); Leonard Ruvinsky, Merrimack, NH (US); Michael C. Freeman, Franklin, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 133 days.

(21) Appl. No.: 11/596,137

(22) PCT Filed: Aug. 5, 2005

(86) PCT No.: PCT/US2005/027857
§ 371 (c)(1),
(2), (4) Date: Nov. 9, 2006

(87) PCT Pub. No.: WO2006/028624

PCT Pub. Date: Mar. 16, 2006

(65) Prior Publication Data
US 2008/0024373 A1    Jan. 31, 2008

Related U.S. Application Data

(60) Provisional application No. 60/599,738, filed on Aug. 6, 2004.

(51) Int. Cl.
*G01R 27/04* (2006.01)
*G01R 35/00* (2006.01)
*H01L 35/00* (2006.01)

(52) U.S. Cl. .................. 324/638; 324/601; 343/700 R
(58) Field of Classification Search ............... 324/638
See application file for complete search history.

(56) References Cited

U.S. PATENT DOCUMENTS

| | | | |
|---|---|---|---|
| 5,532,704 A | | 7/1996 | Ruelle |
| 6,008,753 A | * | 12/1999 | Berg et al. ................. 342/165 |
| 6,329,953 B1 | * | 12/2001 | McKivergan .............. 343/703 |
| 6,741,640 B1 | * | 5/2004 | Johnson ..................... 375/219 |
| 6,842,013 B1 | | 1/2005 | Meloling et al. |
| 7,109,932 B2 | * | 9/2006 | Kadambi et al. ........... 343/703 |
| 2003/0063031 A1 | * | 4/2003 | Wong et al. .......... 343/700 MS |
| 2005/0280577 A1 | * | 12/2005 | Feller .................... 342/357.11 |
| 2006/0082494 A1 | * | 4/2006 | Deininger et al. .......... 342/165 |

\* cited by examiner

*Primary Examiner*—Jeff Natalini
(74) *Attorney, Agent, or Firm*—Sand & Sebolt; Michael Sand; Daniel J. Long

(57) ABSTRACT

An antenna and its associated components are consolidated in a small measurement box, and multiple tests are competed simultaneously, with a single vector network analyzer. This can be done by treating the "Far Field" measurements (typically measured on antenna/RCS ranges) as another port of a larger passive network. After characterization of one ideal "gold" unit (or a sample set of "gold" units), the S-parameters of subsequent units are measured in the same passive test box environment. The results of these subsequent tests are compared to the results of the "gold unit's" test, and if they are repeated to within some tolerance, electrical similarity can be proven.

17 Claims, 2 Drawing Sheets

METHOD AND SYSTEM FOR DETERMINING ANTENNA CHARACTERIZATION

CROSS REFERENCE TO RELATED APPLICATION

This application claims rights under 35 USC 119(e) from U.S. application Ser. No. 60/599,738, filed Aug. 6, 2004, the contents of which are incorporated herein by reference.

STATEMENT OF GOVERNMENT INTEREST

The invention was made with Government support under Contract (Grant) No. M4422 awarded by the Air Force. The Government has certain rights in this invention.

BACKGROUND OF THE INVENTION

1. Technical Field

The present invention relates to antennas and more particularly to a system and process for the characterization of antennas. More particularly the invention relates to a method, system and related apparatus for determining the S-parameters of a plurality of similar antennas, such as in an antenna array, in a rapid and repeatable fashion in an effective, yet inexpensive procedure and at a single test facility.

2. Background Information

A conventional full characterization of antenna parameters is an expensive and time-consuming process involving tests in multiple measurement facilities especially for measuring arrays of antennas. Typically to characterize an antenna, measurements have to be completed on a radar cross section (RCS) range, an antenna range, and a vector network analyzer.

Measuring a large number of antennas as in an antenna array, at three separate facilities is an expensive and time-consuming procedure. The facilities themselves are rare and expensive enough to be limiting by schedule competition with other programs.

To measure and determine the antenna characterization or S-parameters of many types of antennas, and in particular arrays of antenna, requires considerable time expenditure depending upon the particular antenna or antenna array. For example, a one month estimate and considerable costs for characterizing a 6-element (6 antenna) array. Times may be significantly longer or shorter depending upon the size of the array. This becomes a problem when a vast number of similar antennas are produced, which are substantially similar to each other, especially antenna arrays. It is required that each antenna be tested before shipment for commercial use which increases considerably the cost of the antenna and the delivery schedule. It also requires constant access to conventional test facilities and chambers which are expensive to construct, operate or lease, and presents timing problems, especially when shared with the testing of other antennas. Thus, there is a need for an improved method, system, apparatus and test facilities, especially when testing a large number of substantially similar antennas, in order to reduce test time and cost, eliminate the dependence on large test chambers and possibly remote test facilities and their associated cumbersome scheduling constraints.

A means for overcoming such disadvantages of the prior art is needed and is solved by the present invention.

BRIEF SUMMARY OF THE INVENTION

In the present invention it is recognized that arbitrary passive multiport (black-box) systems can be characterized via scattering parameters of a finite number of ports. In the far-field radiation/scattering realm, it requires an infinite number of ports, or far-field angles, to achieve a complete scattering matrix representation. The present invention has demonstrated that a limited number of ports are sufficient to demonstrate similar performance to an ideal "gold" standard antenna, which could be a single antenna, an antenna array, etc.

If an antenna and its associated components are consolidated in a small measurement box, then these multiple tests may be competed simultaneously, with a single or network of vector network analyzers. This can be done by treating the "Far Field" measurements (typically measured on antenna/ RCS ranges) (Radar Cross Section) as another port of a larger passive network. After characterization of one ideal "gold" unit (or a sample set of "gold" units), the S-parameters of subsequent units are measured in the same passive test box environment. The results of these subsequent tests are compared to the results of the "gold unit's" test, and if they are repeated to within some tolerance, electrical similarity can be proven.

Another feature of the present invention is to provide such a system and method for determining antenna characterization by use of an anechoic chamber containing a plurality of signal generating antennas and a transport device for individually supporting initially the "gold standard" antenna and subsequent plurality of similar antennas in the anechoic chamber to ensure consistency in the test procedure.

Another aspect of the invention is to perform a series of tests on a first or "gold standard" antenna and obtaining the test data therefrom. This data is correlated to the test data obtained by the standard test procedures performed on the first antenna in the field and then comparing this first test data with second test data obtained when the same series of tests are performed on each individual antennas under test (AUT), which test data is then compared with the previously obtained first test data obtained from the "gold standard" antenna. This comparison enables the test parameters of each second antenna to be correlated with the first test data of the "gold standard" antenna to ensure that it has the required S-parameters before use in its intended environment.

A further aspect of the invention is to initially field test a first antenna (gold standard antenna) in a radar cross-section range test facility, an antenna range test facility and vector analysis testing, which once completed for the "gold antenna" standard, avoids further such time consuming and expensive testing for all subsequent substantially similar antennas in order to determine the antenna characterization thereof.

The foregoing advantages in construction and operation of the present invention will become more readily apparent from the following description and accompanying drawings.

BRIEF DESCRIPTION OF THE SEVERAL VIEWS OF THE DRAWINGS

The present invention is further described with reference to the accompanying drawing wherein.

DETAILED DESCRIPTION OF THE INVENTION

Figure 1:
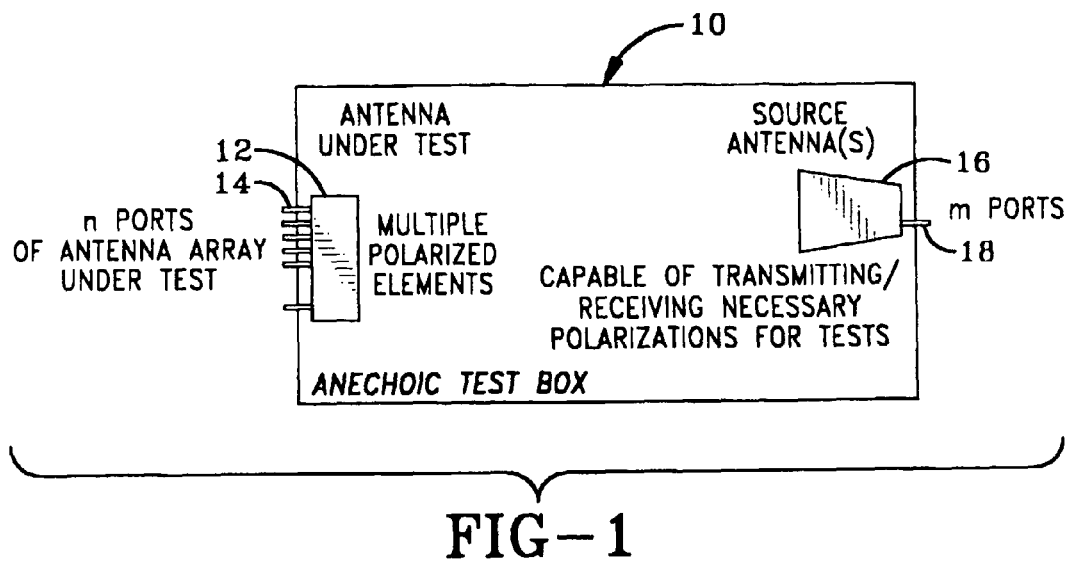
FIG. 1 is a schematic diagram showing an anechoic test box used in the practice of a preferred embodiment of the method and system of the present invention.

Referring to FIG. 1, an anechoic test box 10 is shown on which there is mounted the Antenna Under Test (AUT) 12 with multiple polarized elements and N ports as at 14. There is also a source antenna 16 with M ports as at 18. AUT 12 can be a single antenna, an antenna array, etc. without affecting the concept of the invention.

A given test may include inputs/outputs from the antenna under test (AUT), the source antenna (or any type of measurement antenna), or both the AUT and Source antenna. The AUT is located on a fixture with discrete rotational capabilities for use in data collection at various precalculated or empirically determined angels. The resulting S-parameters of the "gold" AUT and fixture, treated as a "black box", are then compared to the resultant S-parameters of the same fixture with subsequent AUT's. Similar electrical performances (within allowed tolerances) of each "black box" configuration indicate similar antenna characteristics.

By characterizing one (or a sample set of) "gold" unit(s), and determining characteristic S-parameter performance in a given test box in a given configuration, the present invention is able to characterize subsequent, similar antennas with one faster, less expensive test. The large expensive facilities for testing are replaced by small, dedicated test "boxes" which would be inadequate for analyzing antennas via conventional methods but which accurately demonstrated behavior with this method. This approach also lends well to automation. Additionally, this dedicated structure enables antenna performance checks in the production process, allowing for a reduction in physical inspections.

Figure 3:
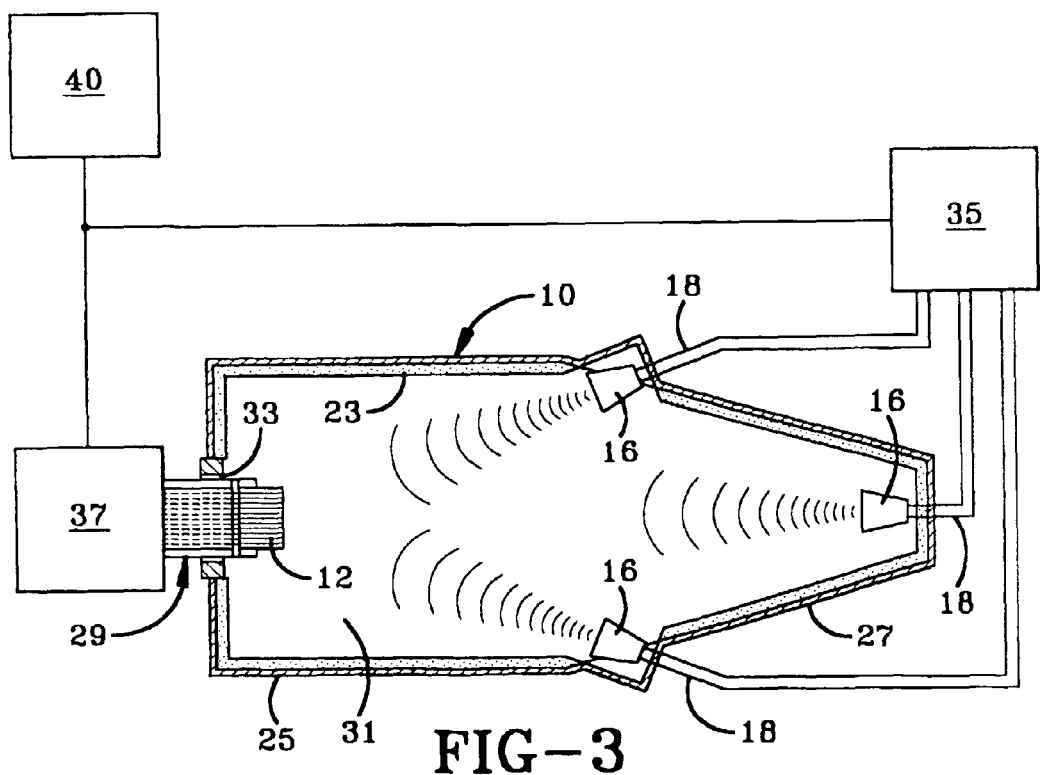
FIG. 3 is a diagrammatic cross-sectional view of the anechoic chamber and transport mechanism of FIG. 2 with the test equipment associated therewith.
Figure 2:
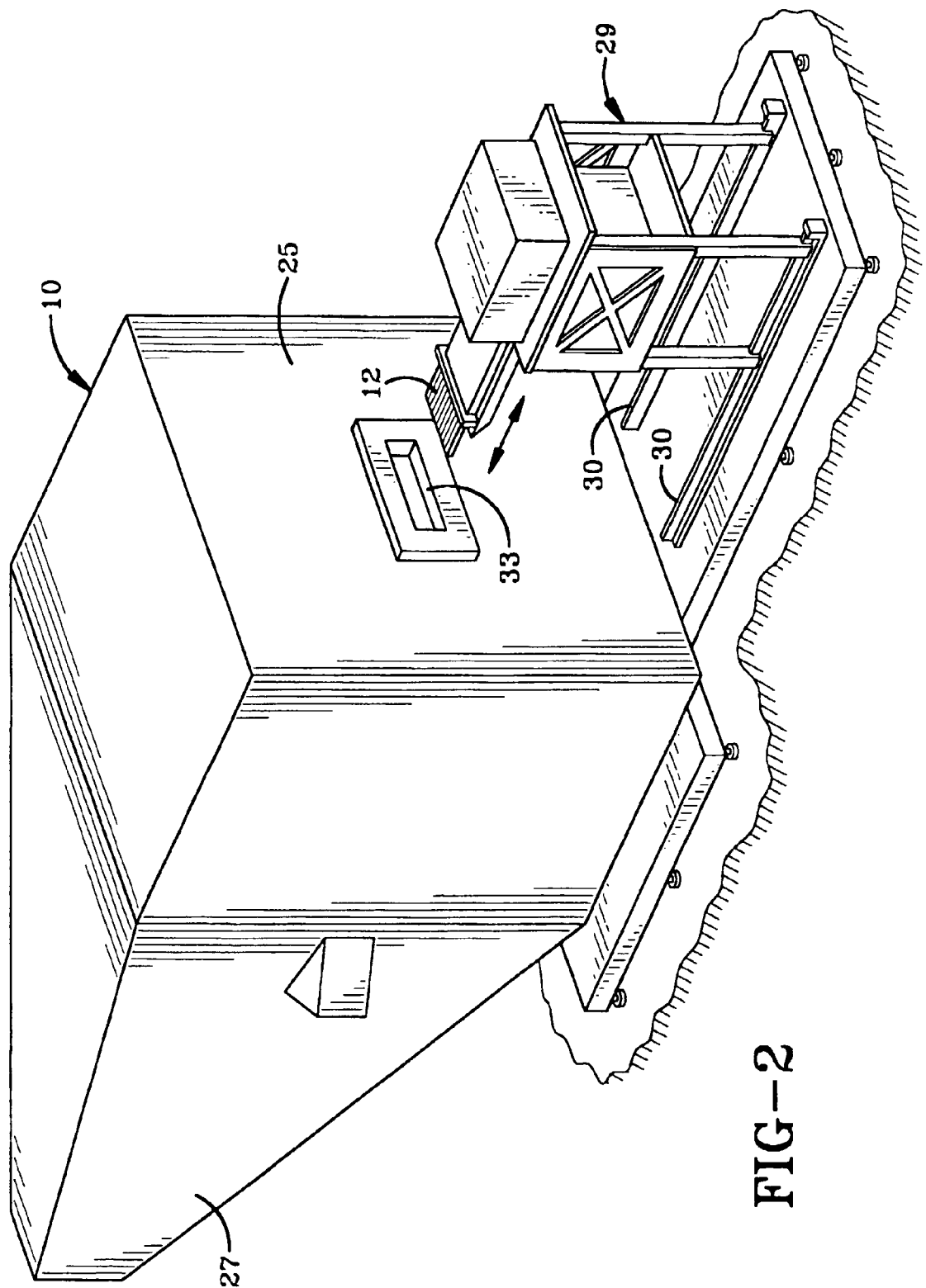
FIG. 2 is a more detailed diagrammatic view of the anechoic test box and transport device for individually supporting the first and subsequent antennas in position within the anechoic chamber.

A more detailed view of the apparatus of the measurement system is shown particularly in FIGS. 2 and 3. Anechoic box 10 will have a usual sound-deadening innerliner 23 or radar absorbent material (RAM), and preferably has a front rectangular-shaped portion 25 and a tapered rear portion 27. A source antenna may include three particularly arranged antennas 16 as shown in FIG. 3, although this number could vary depending upon the particular AUT 12. Anechoic chamber 10 preferably is a fixed stationary structure and the AUT 12 is mounted on a transport device indicated generally at 29. Device 29 may be moveably mounted on a pair of spaced rails 30 for movement of AUT 12 into a test position as shown in FIG. 3, in which position AUT 12 will be inserted into the interior 31 of chamber 10 through an aperture 33. Various types of attachment or securement devices (not shown) will ensure that AUT 12 is always located at a fixed predetermined position within the interior of chamber 31 so that it is accurately spaced repeatedly therein with respect to source antennas 16. Other types of attachment mechanisms (not shown) can be provided on transport device 29 to ensure that each AUT 12 is mounted on device 29 in the same position so as to be located in the exact same position within the interior of anechoic chamber 10 to ensure the accuracy of the test results each time a different AUT 12 is tested within chamber 10.

The various test signals are supplied to source antenna 16 through ports 18 from a source generator 35 which may be a combination of a network analyzer and a 2×6 switch matrix. Commercial examples of this equipment may be a E8362B PNA Series Network Analyzers (2-Port Measurement Equipment) and a 87050A-K06 Multiport Test Set (2×6 Port Switch Matrix). The various test data obtained from AUT 12 upon receiving the transmissions from source antenna 16 is collected by a combination of one network analyzer and one 2×16 switch matrix. Commercial examples of this equipment are a E8362B PNA Series Network Analyzers (2-Port Measurement Equipment), and a 87050A-K16 Multiport Test Set (2×16 Port Switch Matrix), which are collectively indicated at 37 in FIG. 3. This data is fed to a comparator 40 which may consist of a standard computer and monitor. A commercial example of this equipment is: HP Pavilion D4000y and a HP f1905 19" LCD Flat-Panel Monitor. The previous test data from the "gold standard" or first antenna had been previously stored in comparator 40. A comparison of the newly generated test data from AUT 12 then is compared to the "gold standard" test data to determine if the S-parameters of AUT 12 are within the acceptable limits with respect to the previously fully tested "gold standard" antenna.

In summary, a first antenna is tested in the field and in one or more test chambers and by various test apparatus such as on an RCS test range, an antenna range and with a vector network analyzer or other types of test equipment, the S-parameters of this first test antenna referred to as the "gold standard" are determined. This first antenna is then placed within anechoic chamber 10 by transport device 29 and the various signals supplied thereto from source antennas 16. The collected data from the "gold standard" antenna is then collected and stored in comparator 40. Thereafter each individual AUT 12 is positioned in chamber 10 by transport device 29 with preferably the same series of test signals being supplied thereto by antenna 16 or vector network analyzer 37 and the data collected by equipment 37 is fed to comparator 40 and compared with the previously obtained anechoic test data from the "gold standard". Thus, by knowing the actual previously obtained S-parameters of the "gold standard" antenna by the various field tests heretofore used for such determination, and then obtaining test data by subjecting this same "gold standard" antenna to a series of transmitted signals through antenna 16 or vector network analyzer 37 in anechoic chamber 10, provides for the same basis of comparison with the signals obtained by an AUT 12 receiving the same series of test signals from antennas 16 or vector network analyzer 37. Therefore, a vast number of substantially similar AUT 12 can be tested in a relatively short period of time within anechoic chamber 10 by applying the same series of tests thereto and by comparing these results with that of the previously field tested and anechoic chamber tested "gold standard" antenna will provide a determination of the antenna characterization or S-parameters. Thus, each antenna can be easily and quickly tested, and by comparison with the "gold standard" antenna, will ensure that it is operating within acceptable limits. If not, it can then be rejected. This method and system also enables changes to be made during the production of the similar antennas since the tests can reveal that problems are occurring in the mass produced antennas before a large number of faulty antennas are produced.

It is readily understood that other anechoic-shaped chambers can be utilized as well as the number and location of source antenna 16, as well as the means of positioning AUT 12 within chamber 10 than that shown in FIGS. 2 and 3 and described above. Also the same tests need not be applied to each AUT 12 so long as the relationship of the tests with respect to that applied to the "gold standard" antenna is known and can be correlated and the test results correlated therefrom.

While the present invention has been described in connection with the preferred embodiment of the various figures, it is to be understood that other similar embodiments may be used or modifications and additions may be made to the described embodiment for performing the same function of the present invention without deviating therefore. Therefore, the present invention should not be limited to any single embodiment, but rather construed in breadth and scope in accordance with the recitation of the appended claims.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of the invention is an example and the invention is not limited to the exact details shown or described.

The invention claimed is:

1. A system for determining antenna characterization parameters including:
   a first antenna having known antenna characterization parameters;
   a test chamber containing at least one source antenna for performing a series of tests on the first antenna and obtaining first test data therefrom;
   a second antenna similar to the first antenna subjected to the said series of tests in the test chamber to obtain second test data;
   a comparator for comparing the first and second test data to determine the characterization parameters of the second antenna based upon the relationship to the known characterization parameters of the first antenna; and
   a transport device for individually supporting the first and second antennas thereon and for individually accurately positioning said first and second antennas at the same fixed predetermined location within the test chamber with respect to the source antenna when performing the same series of tests individually on the first and second antennas.

2. The system defined in claim 1 wherein the test chamber is an anechoic chamber containing a plurality of source antennas for generating signals for reception by the first and second antennas when individually subjected to said series of tests for obtaining the first and second test data, respectively.

3. The system defined in claim 1 wherein the first antenna is an array antenna, and wherein the second antenna is an array antenna similar to the first antenna.

4. The system defined in claim 1 included a source generator communicating with the at least one source antenna for generating signals supplied to said source antenna for subsequent reception by the first and second antennas when individually placed in the test chamber.

5. The system defined in claim 4 in which the source generator is a network analyzer.

6. The system defined in claim 1 in which the comparator includes a computer and monitor.

7. A method of antenna characterization testing comprising the steps of:
   a) field testing a first antenna to determine certain S-parameters of said first antenna;
   b) subjecting the first antenna in a controlled test facility to a series of tests and obtaining first data therefrom;
   c) correlating the first test data obtained in the controlled test facility to the S-parameters determined on the said first antenna in the field test;
   d) subjecting a second antenna similar to said first antenna to the same series of tests as performed on the first antenna in the controlled test facility and obtaining second data therefrom; and
   e) comparing the first and second test data to determine if S-parameters of the second antenna are within acceptable limits with respect to the known S-parameters of the first antenna determined by the field testing of step (a) without subjecting said second antenna to said field testing.

8. The method defined in claim 7 wherein the step of field testing includes radar cross section (RCS) range testing, antenna range testing and vector network analysis testing.

9. The method defined in claim 7 wherein steps (b) and (c) are carried out by positioning the first and second antennas individually in an anechoic chamber and individually subjecting said antennas to a series of signals transmitted from a plurality of transmitters mounted within said anechoic chamber.

10. The method defined in claim 7 including the steps of individually mounting the first and second antennas on a transport device; and moving said transport device toward the test facility to accurately position said first and second antennas in the same position within said test facility.

11. The method defined in claim 7 wherein the first antenna is an antenna array.

12. A process for antenna characterization comprising the steps of:
    (a) subjecting one antenna in a first test means to a first series of tests to obtain first test data determining S-parameters of said one antenna;
    (b) subjecting the said one antenna to a second series of tests in a second test means and obtaining second test data;
    (c) subjecting a second antenna similar to said one antenna to the same second series of tests in the same second test means and obtaining third test data; and
    (d) comparing said third test data to said second test data to determine if S-parameters of the second antenna are within acceptable limits with respect to the S-parameters of the said one antenna.

13. The process defined in claim 12 wherein step (a) further includes determining the gain, directivity, impedance, bandwidth and efficiency of said one antenna in the first test means.

14. The process defined in claim 12 including placing the said one antenna and similar second antenna individually in an anechoic chamber forming part of the second test means.

15. The process defined in claim 14 including the steps of individually placing the similar second antenna on a transport device, and moving said transport device toward the anechoic chamber to accurately position said second antenna in said anechoic chamber in the same position as the said one antenna.

16. The process defined in claim 12 wherein step (a) includes field testing the said one antenna in an RCS range to determine the RCS of said one antenna.

17. The process defined in claim 12 wherein the said one antenna is an antenna array.

* * * * *